(12) United States Patent
Sirbu et al.

(10) Patent No.: US 6,542,531 B2
(45) Date of Patent: Apr. 1, 2003

(54) VERTICAL CAVITY SURFACE EMITTING LASER AND A METHOD OF FABRICATION THEREOF

(75) Inventors: Alexei Sirbu, Ecublens (CH); Vladimir Iakovlev, Ecublens (CH); Alok Rudra, Blonay (CH); Elyahou Kapon, Lausanne (CH)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 40 days.

(21) Appl. No.: 09/809,239

(22) Filed: Mar. 15, 2001

(65) Prior Publication Data

US 2002/0131464 A1 Sep. 19, 2002

(51) Int. Cl.⁷ ................................................ H01S 5/00
(52) U.S. Cl. ................................... 372/46; 372/96
(58) Field of Search ............................ 372/45, 46, 96

(56) References Cited

U.S. PATENT DOCUMENTS

| 5,985,686 A | | 11/1999 | Yayaraman | 438/32 |
| 5,991,326 A | * | 11/1999 | Yuen et al. | 372/96 |
| 6,341,137 B1 | * | 1/2002 | Jayaraman et al. | 372/50 |
| 6,366,597 B1 | * | 4/2002 | Yuen et al. | 372/96 |

FOREIGN PATENT DOCUMENTS

WO   WO 98/07218   * 2/1998   ............ H01S/3/085

OTHER PUBLICATIONS

N.M. Margalit et al., "Laterally Oxidized Long Wavelength CW Vertical–Cavity Lasers", Appl.Phys.Lett., 69(4), Jul. 22, 1996, pp. 471–472.

Y. Ohiso et al., "1.55 μm Vertical–Cavity Surface–Emitting Lasers with Wafer–fused InGaAsP/InP–GaAs/AlAs DBRs", Electronics Letters, vol. 32, No. 16, Aug. 1st, 1996.

S. Rapp et al., "Near Room–temperature Continuous–wave Operation of Electrically Pumped 1.55μm Vertical Cavity Lasers with InGaAsP/InP Bottom Mirror", Electronic Letters, vol. 35, No. 1, Jan. 7th, 1999.

W. Yuen et al., "High–performance 1.6μm Single–epitaxy Top–emitting, VCSEL", Electronic Letters, vol. 36, No. 13, Jun. 22nd, 2000.

A.V. Syrbu et al., "30° C CW operation of 1.52μm InGaAsP/AlGaAs Vertical Cavity Lasers With In Situ Built–in Lateral Current Confinement by Localised Fusion", Electronic Letters, vol. 34, No. 18, Sep. 3rd, 1998.

(List continued on next page.)

Primary Examiner—Quyen Leung
(74) Attorney, Agent, or Firm—Moetteli & Assoc.; John Moetteli

(57) ABSTRACT

An electrically pumped VCSEL and a method of its fabrication are presented. The VCSEL comprises an active cavity material sandwiched between top and bottom DBR stacks, the top DBR having at least one n-semiconductor layer. The device defines an aperture region between the structured surface of the active cavity material and the n-semiconductor layer of the top DBR stack. The structured surface is formed by a top surface of a mesa that includes at least the upper $n^{++}$ layer of a $p^{++}/n^{++}$ tunnel junction and the surface of a p-type layer outside the mesa. The structured surface is fused to the surface of the n-semiconductor layer of the DBR stack due to the deformation of these surfaces, thereby creating an air gap in the vicinity of the mesa between the fused surfaces. The active region is defined by the current aperture which includes the mesa surrounded by the air gap, thereby allowing for restricting an electrical current flow to the active region, while the air gap provides for the lateral variation of the index of refraction in the VCSEL.

10 Claims, 9 Drawing Sheets

OTHER PUBLICATIONS

M. Ortsiefer et al., "Room–temperature Operation of Index–guided 1.55μm InP–based vertical–cavity surface–e-mitting Laser", Electronics Letters, vol. 36, No. 5, Mar. 2nd, 2000.

J. Boucart et al., "Metamorphic DBR and Tunnel–Juntion Injection: A CW RT Monolithic Long–Wavelength VCSEL", IEEE Journal of Selected Topics in Quantum Electronics, vol. 5, No. 3, May/Jun. 1999, pp. 520–529.

V. Jayaraman et al., "WDM Array Using Long–Wavelength Vertical Cavity Lasers", Proc. SPIE: Wavelength Division Multiplexing Components, vol. 2690, 1996, pp. 325–336. (No month).

* cited by examiner

VERTICAL CAVITY SURFACE EMITTING LASER AND A METHOD OF FABRICATION THEREOF

FIELD OF THE INVENTION

This invention relates to vertical cavity surface emitting lasers (VCSELs), and particularly to electrically pumped, long wavelength VCSELs and multiple wavelength VCSEL arrays, and a method of fabrication thereof.

BACKGROUND OF THE INVENTION

A VCSEL is a semiconductor laser including an active region sandwiched between mirror stacks that can be semiconductor distributed Bragg reflectors (DBRs) [N. M. Margalit et al., "Laterally Oxidized Long Wavelength CW Vertical cavity Lasers", Appl. Phys. Lett., 69 (4), Jul. 22 1996, pp. 471–472], or a combination of semiconductor and dielectric DBRs [Y. Oshio et al., "1.55 µm Vertical-Cavity Surface-Emitting Lasers with Wafer-Fused InGaAsP/InP-GaAs/AlAs DBRs", Electronics Letters, Vol. 32, No. 16, Aug. 1, 1996]. One of the mirror stacks is typically partially reflective so as to pass a portion of the coherent light that builds up in a resonating cavity formed by the mirror stacks sandwiching the active region. The VCSEL is driven by a current forced through the active region. Mirror stacks are typically formed of multiple pairs of layers formed of a material system generally consisting of two materials having different indices of refraction and being easily lattice matched to the other portions of the VCSEL. For example, a GaAs based VCSEL typically uses an AlAs/GaAs or AlGaAs/AlAs material system wherein the different refractive index of each layer of a pair is achieved by altering the aluminum content in the layers.

VCSELs are well adapted as preferred light sources for communication applications, due to the following advantageous features: a single mode signal from a VCSEL is easily coupled into an optical fiber, has low divergence, and is inherently single frequency in operation.

One of important requirements for the operation of a VCSEL is to compensate for the small amount of gain media which is typical for VCSELs due to the compact nature thereof. This is associated with the fact that, in order to reach the threshold for lasing, the total gain of a VCSEL must be equal to the total optical loss of the VCSEL. To compensate for the small amount of gain media, and to enable reaching and maintaining the lasing threshold, it is known to use wafer fusion of one or both of the mirror stacks, with reflectivity values exceeding 99.5%, to the active region. Wafer fusion is a process by which materials of different lattice constant are atomically joined by applying pressure and heat to create a real physical bond.

VCSELs emitting light having a long wavelength are of great interest in the optical telecommunication industry. A long wavelength VCSEL can be obtained by using a VCSEL having an InGaAs/InGaAsP active cavity material, in which case an InP/InGaAsP material system must be used for the mirror stacks in order to achieve a lattice match to the InP. In this system, however, it is practically impossible to achieve DBR based mirrors with high enough reflectivity because of the small difference in the refractive indices in this material system. Many attempts have been made to address this problem including a wafer fusion technique in which a DBR mirror is grown on a separate substrate and fused to the active region.

Another important requirement for fundamental mode operation of a VCSEL and light coupling into a single mode fiber, is current and optical confinement. In order to reduce the light emitting area of the VCSEL (practically to about 5–10 µm), the opening of current flow (current aperture) is restricted through lateral oxidation of Al-containing layers which also creates a lateral refractive index variation for fundamental optical mode operation of these devices. In such a lateral oxidation technique, a mesa is etched into the top surface of the VCSEL wafer, and the exposed sidewalls of an Al-containing layer (typically AlGaAs layer) are exposed to water vapor at elevated temperature. Water vapor exposure causes conversion of the AlGaAs to AlGaO$_x$, some distance in from the sidewall toward the central vertical axis depending on the duration of oxidation. Formation of the current aperture defines the active region of the device which includes the active cavity material where there is a current flow and the light is generated, while lateral refractive index variation allows to control the mode structure of the emitted light. This approach has been used for practically all short-wavelength AlGaAs/Ga(In)As(P) VCSELs (i.e., emitting at 0.65–1.1 µm) and is also applied to long wavelength VCSELs (i.e., emitting at 1.25–1.65 µm) that may comprise DBR mirrors grown in the same material system as the active region [S. Rapp et al., "Near-Room-Temperature Continuous-Wave Operation of Electrically Pumped 1.55 µm Vertical cavity Lasers with InGaAsP/InP Bottom Mirror", Electronic Letters, Vol. 35, No. 1, Jan. 7, 1999], and AlGaAs based DBRs that are as-grown [W. Yuen et al., "High Performance 1.6 µm Single-Epitaxy Top-Emitting VCSEL, Electronic Letters, Vol. 36, No. 13, Jun. 22, 2000] or wafer-fused on the active cavity material grown on InP (as in the above-indicated article of N. M. Margalit et al.). However, this approach leads to a non-planar structure, since mesa etches are required, resulting in a complicated processing scheme and low yield. The lateral oxidation is very sensitive to various factors like temperature, surface quality and defects, and does not allow obtaining current apertures with a precise size, and, above all, uniform enough to be used in the fabrication of multiple wavelength arrays by cavity length engineering. In case of lateral oxidized devices, it is quite difficult to use high performance AlAs/GaAs DBRs with highest refractive index contrast and best thermal characteristics, as compared to other AlGaAs/GaAs DBRs.

The use of the wafer fusion technique allows for obtaining both current and optical confinement during the fusion of the p-type GaAs-based DBRs to the p-side of the active cavity material grown on InP wafers. To this end, a special structuring of one of two contacting wafers is performed. The structured surface consists of a central mesa surrounded by shallow etched regions and a large area of unetched semiconductor. The fusion front in the central mesa and the large area of the unetched semiconductor are in the same plane. The current confinement is obtained by placing a native oxide layer at the fused interface outside the central mesa [A. V. Syrbu, V. P. Iakovlev, C. A. Berseth, O. Dahaese, A. Rudra, E. Kapon, J. Jacquet, J. Boucart, C. Stark, F. Gaborit, I. Sagnes, J. C. Harmand and R. Raj, "30° CW Operation of 1.52 µm InGaAsP/AlGaAs Vertical Cavity Lasers with in situ built-in lateral current confinement by localized fusion", Electronic Letters, Vol. 34, No. 18, Sep. 3, 1998; or by placing a proton implanted region at the fused interface outside the central mesa (U.S. Pat. No. 5,985,686). This approach, however, suffers from the following drawbacks: the fused p-GaAs-based and p-InP-based interfaces are normally highly resistive resulting in a substantial heating of the device; and it is very difficult to optimize p-AlGaAs/GaAs DBRs for long wavelength VCSELs to have both high reflectivity (low absorption) and low resistivity.

According to a different approach of the long wavelength VCSEL fabrication technique, tunnel junctions can be used to inject holes into the active region, allowing using n-type DBRs on both sides of the active cavity material. In U.S. Pat. WO 98/07218, the p-side of a InP-based active cavity material is fused to the p-GaAs side of an AlGaAs/GaAs based structure including the n-type DBR stack and the $n^{++}/p^{++}$ tunnel junction. Standard mesa etching and AlGaAs wet oxidation are performed for lateral optical and current confinement in these devices. Besides the above-mentioned drawbacks related to this particular lateral confinement technique and to highly resistive p-GaAs/p-InP fused junctions, this approach suffers from the known difficulty in obtaining low resistive reversed biased tunnel junctions in GaAs, as compared to lower band-gap materials.

In a more recent approach, the so-called "buried tunnel junction structure" formed in the low band-gap InP-based active cavity material is used. [M. Ortsiefer et al., "Room-Temperature Operation of Index-Guided 1.55 µm In-P-based Vertical cavity Surface-Emitting Laser", Electronic Letters, Vol. 36, No. 13, Mar. 2, 2000]. This VCSEL structure comprises one oxide DBR and one semiconductor DBR. The n-type semiconductor DBR, the cavity material terminating with a p-type material, and the $p^{++}/n^{++}$ tunnel junction structure are grown in the first epitaxial process. Then, a shallow mesa structure is etched through the tunnel junction until reaching the $p^{++}$ region and regrown with a n-type InP layer in the second epitaxial process. This is followed by the deposition of an oxide DBR on the n-InP. In this structure, the buried tunnel junction provides a means for lateral current confinement. However, an oxide DBR with intrinsically low thermal conductivity is placed between the active region and the heat-sink. The final device represents a free standing epitaxial structure without a substrate, thereby adding complexity in handling and processing such devices and reducing the yield.

The article "Metamorphic DBR and Tunnel-Junction Injection: A CW RT Monolithic Long-Wavelength VCSEL", J. Boucart et al., IEEE Journal of Selected Topics in Quantum Electronics, Vol. 5, No. 3, 1999, pp. 520–529 discloses a VCSEL comprising a tunnel junction incorporated into the active cavity material and a metamorphic n-type AlGaAs/GaAs DBR grown over the active cavity material in the same epitaxial process. In this case, the heat dissipation is improved due to the good thermal conductivity of the n-AlGaAs DBR. The lateral current confinement is obtained as a result of deep proton implantation through the top AlGaAs/GaAs DBR and tunnel junction. However, such a structure is characterized by the lattice mismatch of 3.7% between GaAs-based and InP-based compounds, resulting in a high density of defects in the metamorphic AlGaAs/GaAs DBR. These defects propagate into the active region which may result in a fast degradation of the device. The proton implantation also creates defects and especially in the InP-based active cavity material. Additionally, the resulting structure does not comprise a means for lateral optical confinement.

New generations of local area networks will use the wavelength division multiplexing (WDM) concept in order to achieve broad band transmission. Multiple wavelength VCSEL arrays may play an important role in these systems. The article "WDM Array Using Long-Wavelength Vertical Cavity Lasers" V. Jayaraman and M. Kilcoyne in Proc. SPIE: Wavelength Division Multiplexing Components, vol. 2690, 1996, pp. 325–336, discloses optically pumped VCSEL arrays emitting at 1550 nm in which cavity length of different VCSELs in array is changed by selective etching of an InGaAsP/InP superlattice which is included in the VCSEL cavity. The disadvantage of this device structure is that it also does not include a means for lateral optical confinement.

SUMMARY OF THE INVENTION

There is accordingly a need in the art to improve the operation of long wavelength VCSELs by providing a novel VCSEL device structure, and a method of its fabrication.

The main idea of the present invention consists of the following. A VCSEL device structure that includes an active cavity material sandwiched between two DBRs is formed with an active region defined by an aperture between a structured surface of the active cavity material and a substantially planar surface of a n-type layer of one of the DBRs, the structured surface and the planar surface of the n-type layer being fused to each other. The structured surface is formed by a top surface of a mesa, which includes at least an upper $n^{++}$ layer of a $p^{++}/n^{++}$ tunnel junction formed on top of a p-semiconductor layer which is part of the active cavity material, and a top surface of a p-type layer (i.e., either the $p^{++}$ layer of the tunnel junction, or the p-semiconductor layer, as the case may be) outside the mesa. The structured surface (i.e., both the upper surface of the mesa and the surface of the p-type layer outside the mesa) is fused to the planar surface of the n-type layer of the DBR, as a result of deformation of these surfaces. As a consequence, an air gap is formed in the vicinity of the mesa between the fused surfaces, presenting the aperture between the fused surfaces. This allows for restricting an electrical current flow to the active cavity material (i.e., the formation of the current aperture which defines the active region), and for lateral variation of the index of refraction within the active region.

Thus, the aperture defining the active region includes the mesa (at least the upper $n^{++}$ layer of the tunnel junction) clamped by the wafer fusion between the structured surface of the active cavity material and the substantially planar surface of the n-type layer of the DBR stack. The air gap existing between the fused surfaces provides a lateral refractive index variation in the proposed device structure.

The term "p-type layer outside a mesa" used herein signifies a layer of the active cavity material, which is either a p-layer underneath a $p^{++}/n^{++}$ tunnel junction structure or the lower $p^{++}$ layer of the tunnel junction. The term "fusion" signifies a wafer fusion technique consisting of atomically joining two surfaces by applying pressure and heat to create a real physical bond between the fused surfaces.

Thus, according to the technique of the present invention, a mesa is formed in the tunnel junction (a stack of $p^{++}$ and $n^{++}$ layers) on top of a p-layer which is part of the active cavity material, and the wafer fusion is applied between a lower n-type planar layer of the DBR and the structured surface of the active cavity material. This process, due to deformation of the wafers (DBR structure and the active cavity material structure), results in a specific topology of the layers around the mesa and in the creation of an air gap defined by the height of the mesa and the pressure applied at fusion temperature. The provision of the air gap allows for the lateral refractive index variation in the active region of the device. The provision of an electric field directed from top to bottom causes both the tunnel junction in the mesa and the n-p (or $n-p^{++}$) fused interface to be reversed biased, thereby restricting the current flow through the mesa.

The VCSEL device according to the invention is fabricated in the following manner:

An active cavity material terminating with a $p^{++}/n^{++}$ tunnel junction is grown on a InP substrate. The active cavity material incorporates a bottom n-type spacer, a multi-quantum well structure, and a top spacer terminating with a p-layer on which the tunnel junction is grown. Then, a mesa-structure is etched through the tunnel junction up to either the p-layer or $p^{++}$-layer (generally, the p-type layer), thereby obtaining a structured surface of the active cavity material terminating with the $n^{++}$-layer on the top of the mesa and the p-type layer outside the mesa. Thereafter, the fusion of an n-type AlAs/GaAs DBR to the structured surface of the active cavity material is carried out by contacting these wafers face to face and applying a pressure at elevated temperature. By this, due to deformation of the wafers, a high quality fusion of both the $n^{++}$ material on the top of the mesa and the p (or $p^{++}$) material outside the mesa to the n-type AlAs/GaAs DBR is obtained. The InP substrate is then selectively etched, and a bottom n-type AlAs/GaAs DBR is fused to the n-side of the active cavity material structure. The GaAs substrate of the top DBR is selectively etched, and ohmic contacts are deposited onto both sides of the device.

When a bias voltage is appropriately applied to the contacts of the device so that the corresponding electrical field is directed from top to bottom (direct voltage), both the tunnel junction in the mesa and the n-p (or n-$p^{++}$) fused interface are reverse-biased. The reverse-biased tunnel junctions are well conducting and the reverse-biased n-p (or n-$p^{++}$) fused interface is not conducting. Therefore, the restriction of the current flow through the mesa (i.e., the formation of the current aperture) is obtained. The part of the active cavity material where the current flows after passing through the current aperture is the active region of the device where the light is generated. Electrical localization can be further improved by forming an additional electrical confining layer, such as a proton implantation layer on the active cavity material structure around the mesa, prior to performing fusion to the n-DBR.

Thus, according to one aspect of the present invention, there is provided a vertical cavity surface emitting laser (VCSEL) device structure, which comprises a semiconductor active cavity material sandwiched between top and bottom distributed Bragg reflector (DBR) stacks, the top DBR stack including at least one n-type semiconductor layer, and which defines an active region for generating light in response to the application of a direct voltage to device contacts, wherein:

said active cavity material comprises a multiquantum well stack sandwiched between bottom and top spacer regions, the top spacer region terminating with a p-layer and a $p^{++}/n^{++}$ tunnel junction on top of said p-layer, each of the $p^{++}$ and p-layer presenting a p-type layer, at least the upper $n^{++}$ layer of the tunnel junction being a mesa emerging from the underlying p-type layer, a structured surface of the active cavity material being formed by an upper surface of the mesa and an upper surface of the p-layer outside the mesa;

said active region is defined by a current aperture including the mesa surrounded by an air gap between the fused structured surface of the active cavity material and the surface of the n-type semiconductor layer of the DBR stack.

The VCSEL device structure according to the invention may comprise at least one additional active region sandwiched between the same top and bottom DBRs, the active regions being fabricated starting from the same active cavity material. The different active regions have separate contacts and electrical isolation, thereby allowing to perform separate electrical pumping of every active region. The different active regions may be designed to have different cavity lengths so that light emitted through the DBRs will be of different wavelengths. To this end, the mesas defining different active regions can be fabricated of different heights, and consequently different active regions will have different cavity lengths. This is implemented by making said at least one additional mesa terminating with an additional n-type layer on top of the $n^{++}$ layer of the tunnel junction. Preferably, this additional n-type layer has a thickness not exceeding ⅛ of the emission wavelength inside the VCSEL structure, and is composed of a certain number of pairs of layers, the layers of each pair being of different chemical composition. If n such additional mesas (active regions) are provided, each of the additional mesas contains a portion of the additional n-type layer of a thickness different to that of the other additional mesas. In order to provide an equal minimal wavelength separation between the light emitted through the DBRs sandwiching different active regions, the difference between the thickness values of the active cavity material including the additional n-type layer in corresponding active regions is made equal.

According to another aspect of the present invention, there is provided a method of fabrication of a vertical cavity surface emitting laser (VCSEL) device structure, the method comprising the steps of:

(a) growing a semiconductor active cavity material consisting of a multiquantum well layer stack sandwiched between bottom and top spacer regions, the top spacer region terminating with a p-layer and a $p^{++}/n^{++}$ tunnel junction grown on top of the p-layer, each of the $p^{++}$- and p-layer presenting a p-type layer;

(b) etching the active cavity material formed in step (i) to form a mesa including at least the upper $n^{++}$ layer of the tunnel junction emerging from the underlying p-type layer, thereby creating a structured surface of the active cavity material formed by the upper surface of the mesa and the upper surface of the p-type layer outside the mesa;

(c) applying a wafer fusion between the structured surface of the active cavity material and a substantially planar surface of a n-type semiconductor layer of a first distributed Bragg reflector (DBR) stack, thereby causing deformation of the fused surface around the mesa and defining an aperture region for electrical current flow therethrough, the aperture region including the mesa surrounded by an air gap between the deformed fused surfaces and defining an active region of the device;

(d) forming a second DBR stack on the surface of the active cavity material opposite to the structured surface;

(e) forming ohmic contacts on the VCSEL device structure to enable the electrical current flow through the current aperture to the active region.

To form the VCSEL device structure containing at least one additional active region starting from the same active cavity material, an additional n-type layer is provided on top of the $n^{++}$-layer of the tunnel junction, prior to performing step (ii). In this case, during step (ii), at least one additional mesa is formed containing also a portion of this additional n-type layer.

Distinguished from the known techniques of fabricating long wavelength VCSELs based on the tunnel junction approach, the technique of the present invention allows using a high structural quality AlAs/GaAs DBR with very good thermal conductivity. Both lateral electrical and optical confinements are obtained while performing the fusion of the AlAs/GaAs DBR to the active cavity material with a low resistivity $n^{++}$InP-based/n-GaAs fused junction.

It should be noted that the method of fabrication of the device according to the invention is simple, does not include any non-standard process, and allows the fabrication of multiple wavelength VCSEL arrays. The final device is mechanically stable allowing a large scale and low cost production.

BRIEF DESCRIPTION OF THE DRAWINGS

In order to understand the invention and to see how it may be carried out in practice, several embodiments will now be described, by way of non-limiting examples only, with reference to the accompanying drawings, in which.

DETAILED DESCRIPTION OF THE INVENTION

Figure 1A:
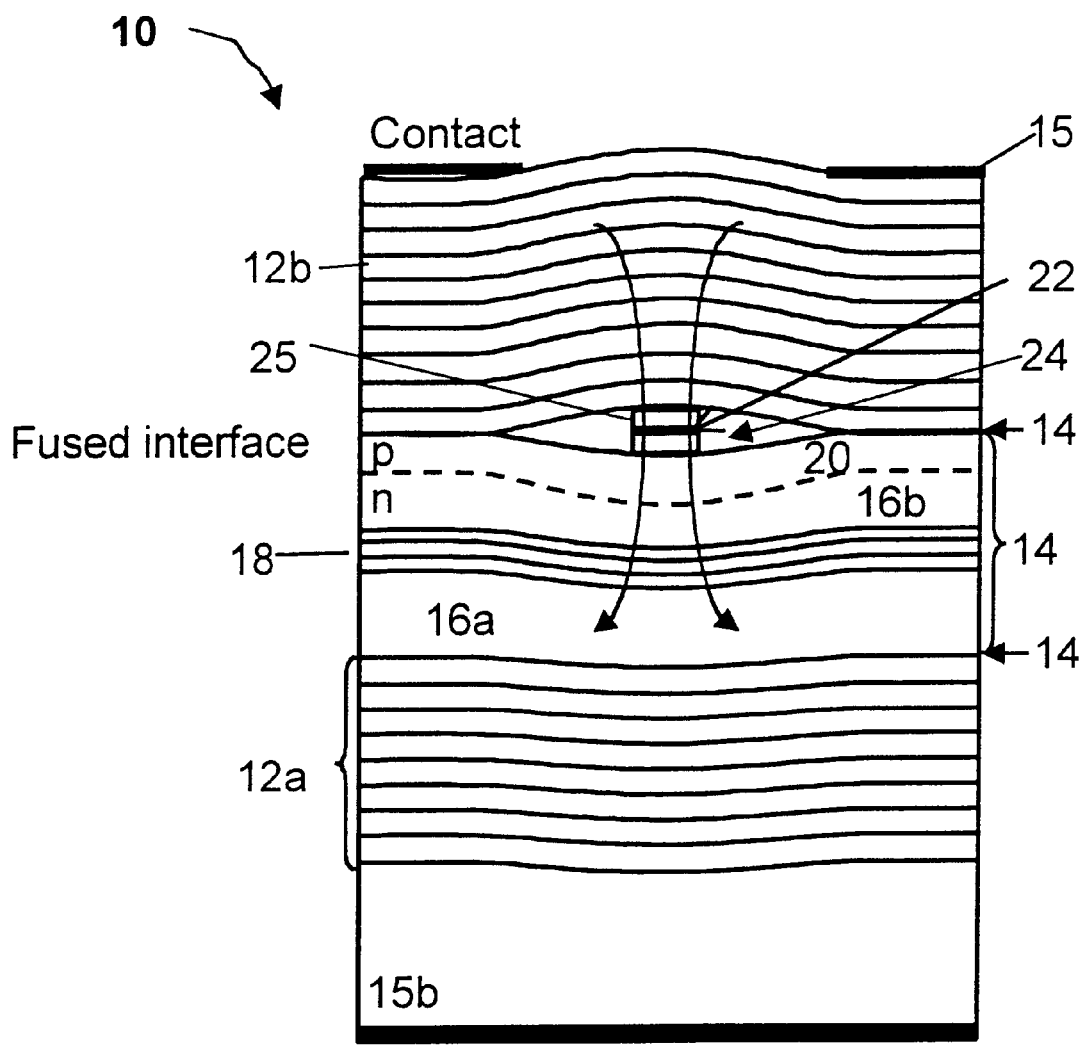
FIG. 1A illustrates a layer structure of a VCSEL device according to one embodiment of the invention.

FIG. 1A illustrates a VCSEL device structure, generally designated 10, according to one embodiment of the present invention. The device 10 is composed of bottom and top n-AlAs/GaAs DBRs 12a and 12b, and an active cavity material, generally at 14, therebetween. The DBRs 12a and 12b are bonded to, respectively, a bottom surface 14a and an upper, structured surface 14b of the active cavity material 14, by wafer fusion. Ohmic contacts, generally at 15, are provided on opposite sides of the device 10.

The active cavity material 14 is a structure incorporating a bottom n-type spacer 16a, a multi-quantum well (MQW) structure 18, a top spacer 16b terminating with a p-type layer 20, and a mesa 22, which is $p^{++}/n^{++}$ tunnel junction composed of a $p^{++}$ bottom layer and a top $n^{++}$ layer. Hence, the structured surface 14b is formed by the upper surfaces of the mesa 22 and of the p-type layer 20 outside the mesa 22. The lower surface of the n-type DBR 12b (i.e., of the n-semiconductor layer of the mirror structure) at one side and the structured surface 14b at the other side form a fused interface. The mesa 22 is clamped between the fused surfaces due to deformation thereof, an elongated air gap 24 being created in the vicinity of the mesa 22. The mesa within the air gap between the fused deformed surfaces presents an aperture region 25 for an electrical current flow therethrough, while the air gap provides lateral refractive index variation for optical mode confinement. The current aperture 25 defines an active region as a part of the active cavity material 14 where the current flows after passing through the current aperture 25 and where light is generated.

The application of a bias voltage to the contacts 15 results in an electrical field directed from top to bottom, such that the tunnel junction in the mesa 22 and the n-p fused interface are reversed biased, being, respectively, well conducting and not conducting. The restriction of the current flow through the mesa is thereby obtained.

Figure 1B:
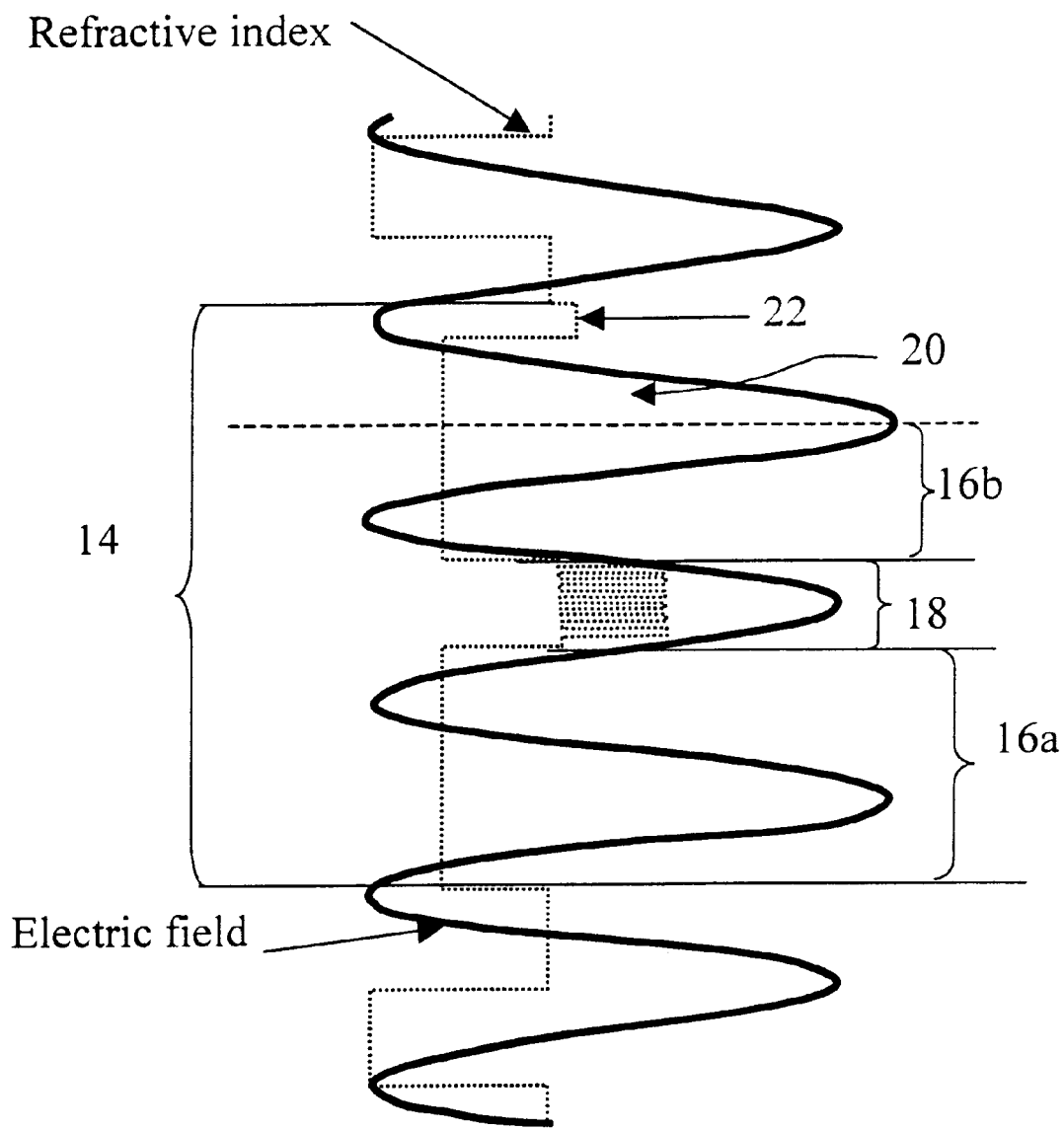
FIG. 1B illustrates the refractive index variation and standing optical wave within an active cavity material and adjacent DBRs of the device of FIG. 1A, and FIGS. 2 to 4 illustrate the fabrication of the VCSEL device of FIG. 1A.

FIG. 1B shows refractive index variation within the active cavity material and adjacent DBRs of the VCSEL device structure 10, and the standing wave (electric field) profile at the emission wavelength. As shown, that the region of the multi-quantum well structure 18 is situated in a maximum of electric field, while the tunnel junction TJ is situated in a minimum of the standing wave, thus not introducing absorption of the light emitted by the VCSEL device structure 10.

Figure 2:
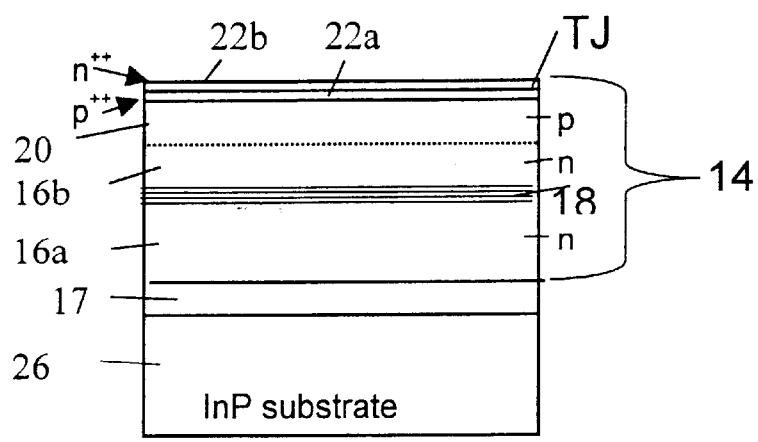
Figure 3:
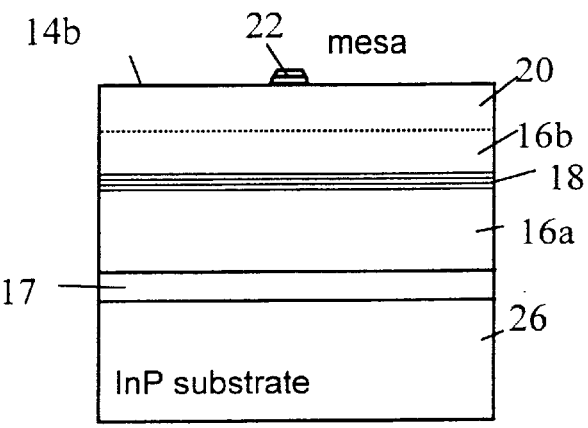
Figure 4:
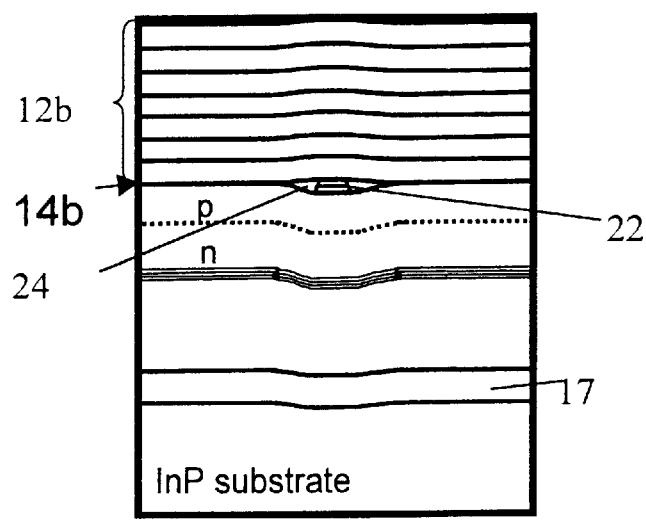

The main steps in the fabrication of the device 10 will now be described with reference to FIGS. 2–4:

In the first step (FIG. 2), the active cavity material 14 (wafer structure) is fabricated by sequentially growing on a n-type InP substrate 26, an InGaAsP-etch-stop layer 17, the bottom n-InP spacer layer 16a, the undoped MQW structure 18, the top InP spacer layer 16b terminating with the p-type InP layer 20, and the $p^{++}/n^{++}$ tunnel junction TJ.

In the present example, the following layers' parameters are used. The InGaAsP-etch-stop layer 17 has the maximum of photoluminescence $(PL_{max})$ at 1.4 μm (i.e., $PL_{max}$ =1.4 μm) and a thickness of 113 nm. The bottom n-InP spacer layer 16a has a doping level, n, of $3 \cdot 10^{17}$ cm$^{-3}$ and a thickness of 305 nm. The undoped MQW structure 18 comprises 6 quantum wells of InGaAsP with $PL_{max}$=1.54 μm and thickness of 8 nm, and 7 barriers of InGaAsP with $PL_{max}$=1.38 μm and thickness of 9.4 nm. The top InP spacer layer 16b comprises 101 nm of undoped InP. The p-type InP layer 20 has a thickness of 192 nm and a doping level p=$5 \cdot 10^{17}$ cm$^{-3}$. The $p^{++}/n^{++}$ tunnel junction TJ is formed by the $p^{++}$-InGaAs layer 22a with a doping level p=$5 \cdot 10^{19}$ cm$^{-3}$ and thickness of 15 nm, and the $n^{++}$-InGaAs layer 22b with a doping level n=$5 \cdot 10^{19}$ cm$^{-3}$ and thickness of 15 nm, the tunnel junction TJ thus having the total thickness of 30 nm. Generally, the thickness of the tunnel junction ranges between 20 and 50 nm.

In the second step (FIG. 3), the mesa-structure 22 is etched through the tunnel junction TJ using a selective etching in a $H_3PO_4$:$H_2O_2$:$H_2O$ based solution, thereby obtaining the structured surface 14b of the active cavity material structure 14. In the present example, the etching is performed using a 10 μm diameter photoresist mask and is continued until the p-type layer 20 is reached, the surface of the layer 20 thereby presenting the p-type layer outside the mesa to be fused to the n-type DBR 12b. It should, however, be noted that the etching could continue until the $p^{++}$ layer 22a of the tunnel junction is reached, in which case the surface of layer 22a will present p-type layer outside the mesa to be fused.

In the third step (FIG. 4), the n-type DBR stack 12b and the active cavity material 14 are brought into face-to-face contact, and a pressure at elevated temperature is applied, thereby performing the fusion of the surface of the lower n-semiconductor layer of the DBR 12b to the structured surface 14b. The DBR stack 12b is a AlAs/GaAs DBR structure grown by Metalo-Organic Chemical Vapor Deposition (MOCVD) on a GaAs-substrate, and comprises 25 pairs of AlAs with the doping level n=$10^{18}$ cm$^{-3}$ and thickness of 130 nm, and GaAs with the doping level n=$10^{18}$ cm$^{-3}$ and thickness of 114 nm.

The fusion set-up, which is basically a pneumatic press, allows changing the pressure applied to the wafers that are in contact at different stages of the fusion process. In order to avoid defects formation in the active region, it is very important that, during purging at room temperature, the pressure applied to the wafers does not exceed 0.5 bar. This low pressure is kept during the heating cycle till reaching the fusion temperature of 650° C. Then, the pressure is gradually increased up to 2.0 bar, and the wafers are kept in these conditions for 30 minutes. During the fusion process, the wafers are deformed, and a high quality fusion of both the $n^{++}$ material on the top of the mesa 22 and the p-type material outside the mesa to the n-type AlAs/GaAs DBR 12b is obtained, and the air gap 24 is formed.

In the last step, the InP substrate is selectively etched in HCl till reaching the InGaAsP etch stop layer 17 which is also selectively etched in a $H_3PO_4$:$H_2O_2$:$H_2O$ solution. Then the bottom n-type AlAs/GaAs DBR 12a is fused to the n-side of the active cavity material. In the present example, the DBR 12a comprises 27 pairs of AlAs and GaAs layers with the same thickness and doping level values as those of the layers in the top DBR stack 12b. The GaAs substrate of the top DBR is selectively etched in a $H_2O_2$—$NH_3OH$ solution till reaching the first AlAs layer which acts as an etch-stop and which is also selectively etched in HF, and Ni—Au—Ge—Au ohmic contacts 15 are deposited onto both sides of the device. The VCSEL device structure 10 obtained according to this process emits at 1520 nm.

Figure 5:
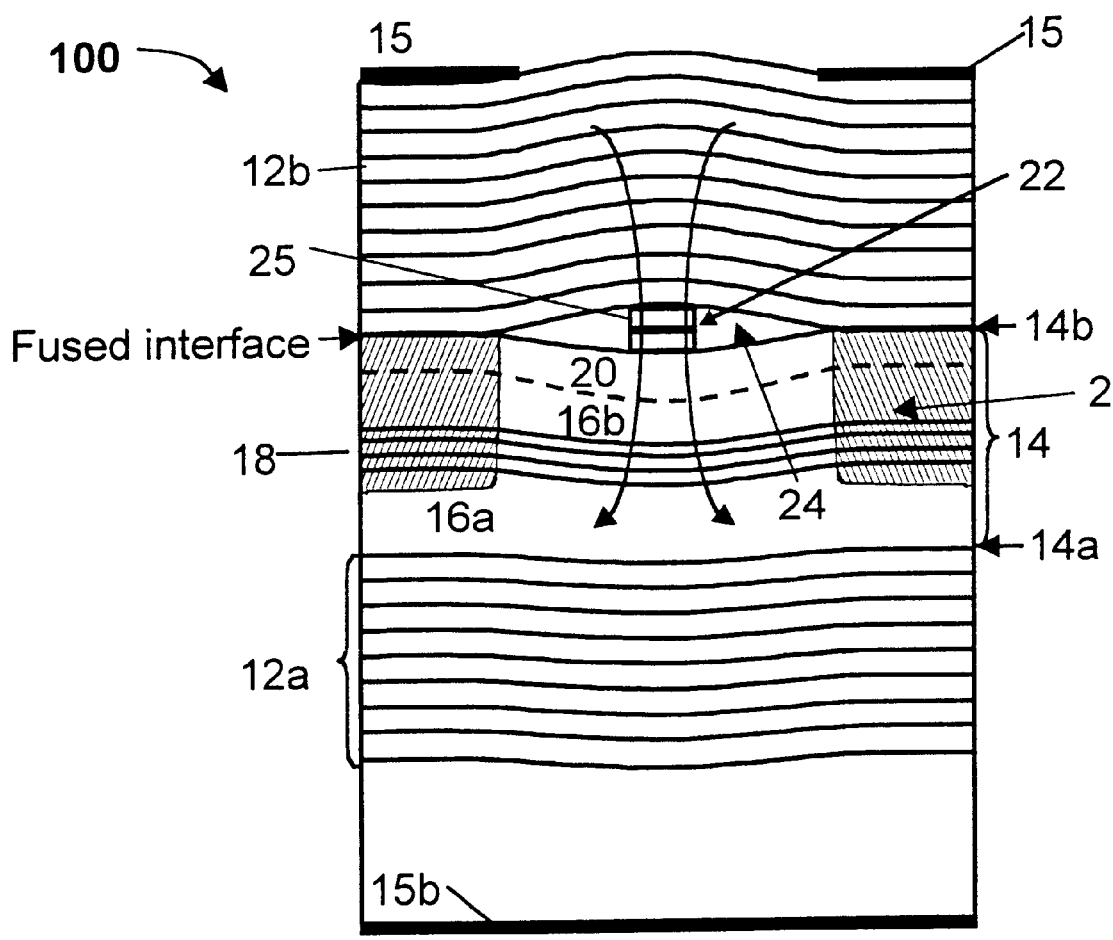
FIG. 5 is a schematic representation of a VCSEL device according to another embodiment of the invention.
Figure 6:
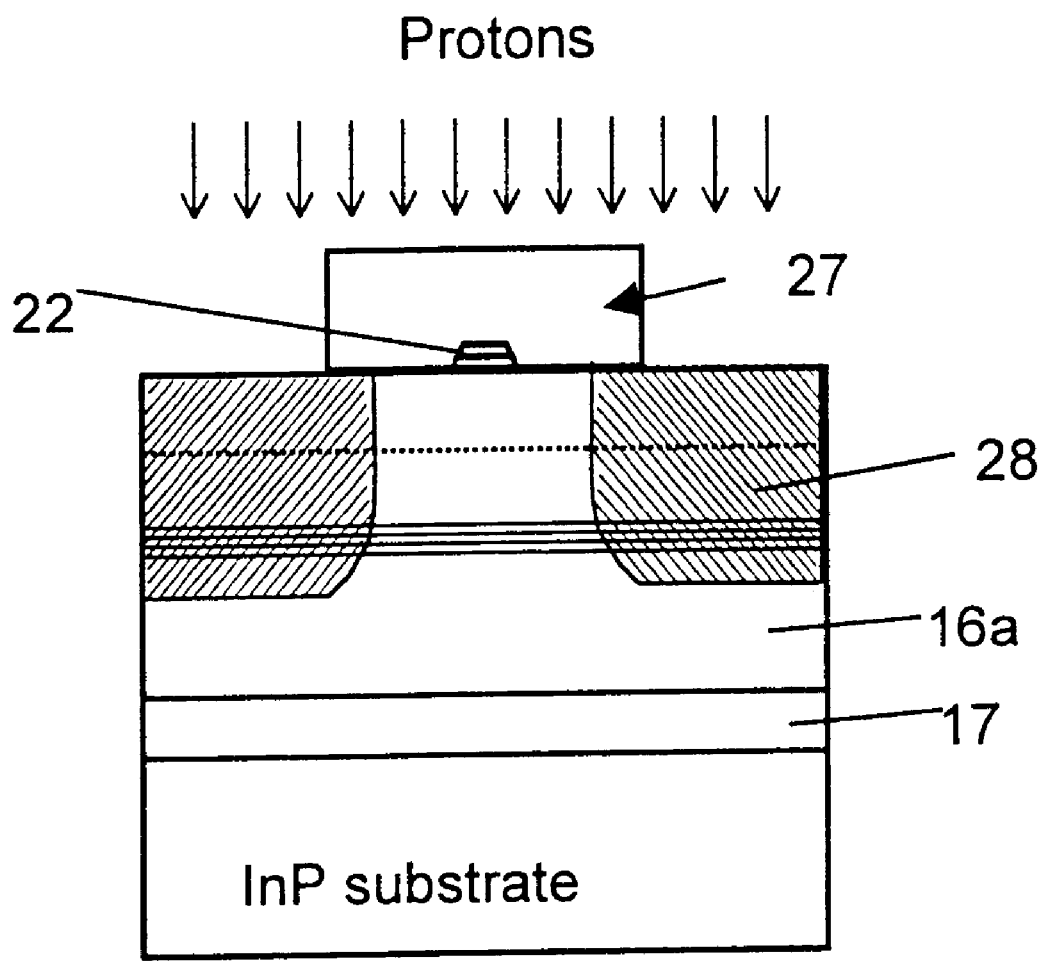
FIG. 6 illustrates the fabrication of the VCSEL device of FIG. 5.

Referring to FIGS. 5 and 6, there is illustrated a VCSEL device structure 100 according to another embodiment of the present invention. To facilitate understanding, the same reference numbers are used for identifying those components that are identical in the devices 10 and 100. The device 100 is fabricated using a proton implantation through the active cavity material 14 outside the mesa 22 prior to performing the fusion of the top DBR 12b, thereby allowing to further improve electrical localization through the aperture region 25 of the VCSEL device structure 100.

To manufacture the device 100, the structured active cavity material preparation is carried out as described above with respect to the fabrication of the device 10, and thereafter, as shown in FIG. 6, a photoresist disc 27 are formed over the mesa 22 in such a way that this disc is concentric with the mesa. The disc 27 serves as a mask having a diameter of 30 µm and a thickness of 2 µm. Masking of the mesa is followed by a proton implantation of the surface of the active cavity material 14 with a doze of $5 \cdot 10^{14}$ at an energy of 80 keV. The implantation energy and dose are selected in such a way that an implantation layer 28 (FIG. 5) reaches the bottom n-InP spacer 16a.

After the proton implantation, the photoresist mask 27 is removed in acetone and oxygen plasma, and the following steps are similar to those described above with respect to the fabrication of the device 10. As a result, the VCSEL device 100 is obtained having an additional proton implantation current confining layer 28, which only reaches the outer boundary of the air-gap 24 surrounding the mesa 22, and does not introduce defects in the active region defined by aperture 25 because it is situated outside the active region and quite away therefrom. Implantation of oxygen or other ions can be also used for this purpose.

Figure 7:
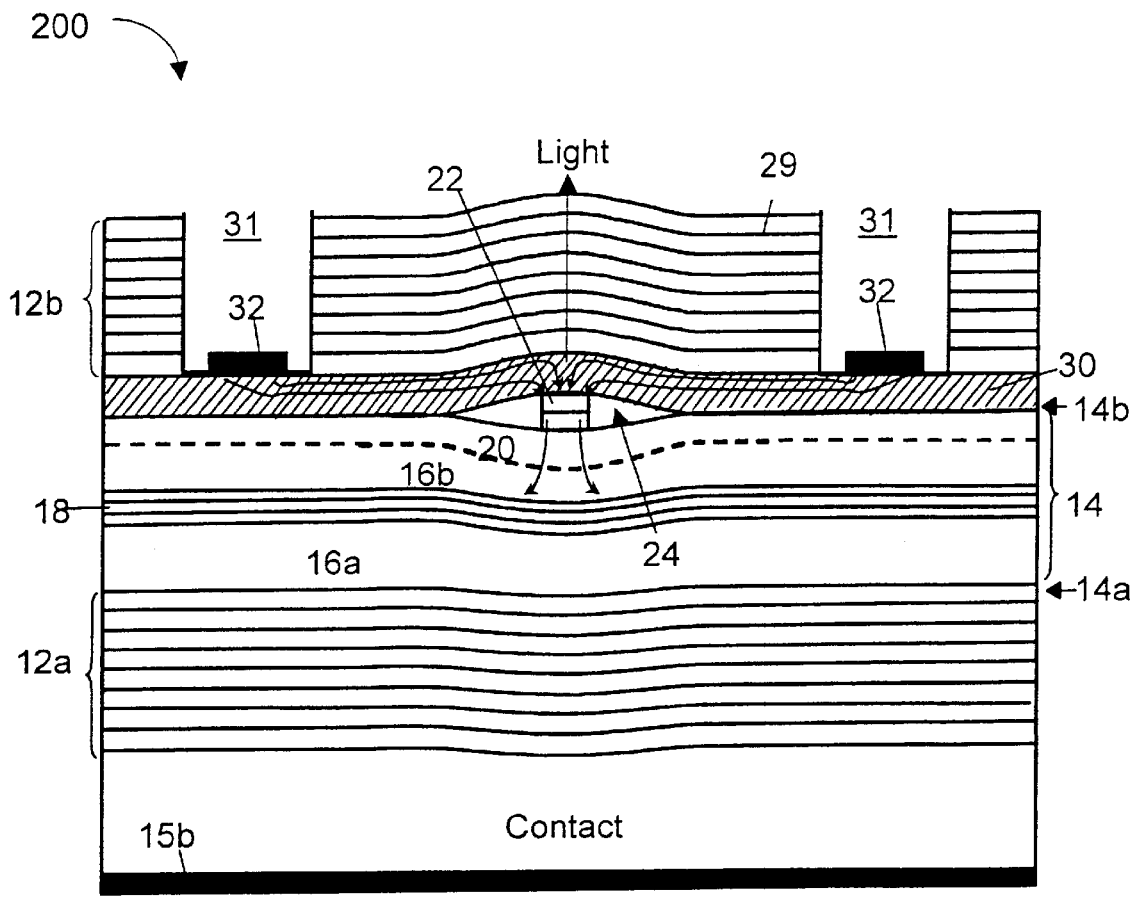
FIG. 7 is a schematic representation of a VCSEL device according to yet another embodiment of the invention.

FIG. 7 schematically illustrates a VCSEL device structure 200 according to yet another embodiment of the invention. Similarly, the same reference numbers are used for identifying the components which are common with the previously described examples. In the present example of FIG. 7, a top DBR 12b is a AlAs/GaAs stack, in which only a top GaAs layer 30 is n-type doped with a carrier concentration of $5 \cdot 10^{18}$ cm$^{-3}$, and all other layers are undoped. The DBR stack 12b is brought into contact with the active cavity material 14 and the top n-GaAs layer 30 of the DBR stack 12b is fused to the structured surface 14b of the active cavity material 14 in the above-described manner. Thereafter, the GaAs-substrate of the top DBR 12b is selectively etched in a $H_2O_2$—$NH_3OH$ solution. Reactive plasma dry etching in $Cl_2$—$CH_{-4}$—Ar is used to form an annular recess 31 in the top DBR stack 12b till reaching the n-type GaAs layer 30, and to thereby define a central stack region 29 of the top DBR 12b surrounded by this annular recess 31. This process is followed by depositing top ohmic contacts 32 inside the recess 31.

When a direct voltage is applied between the top contacts 32 and a bottom contact 15b, an electrical current passes along the n-type layer 30 towards the aperture region 25 and, then, through the active region. The advantage of using the top DBR 12b with all the layers, except for the top layer 30, being undoped is in reduced light absorption in the DBR through which light is extracted from the device, thereby allowing increasing the VCSEL emission power.

Figure 8:
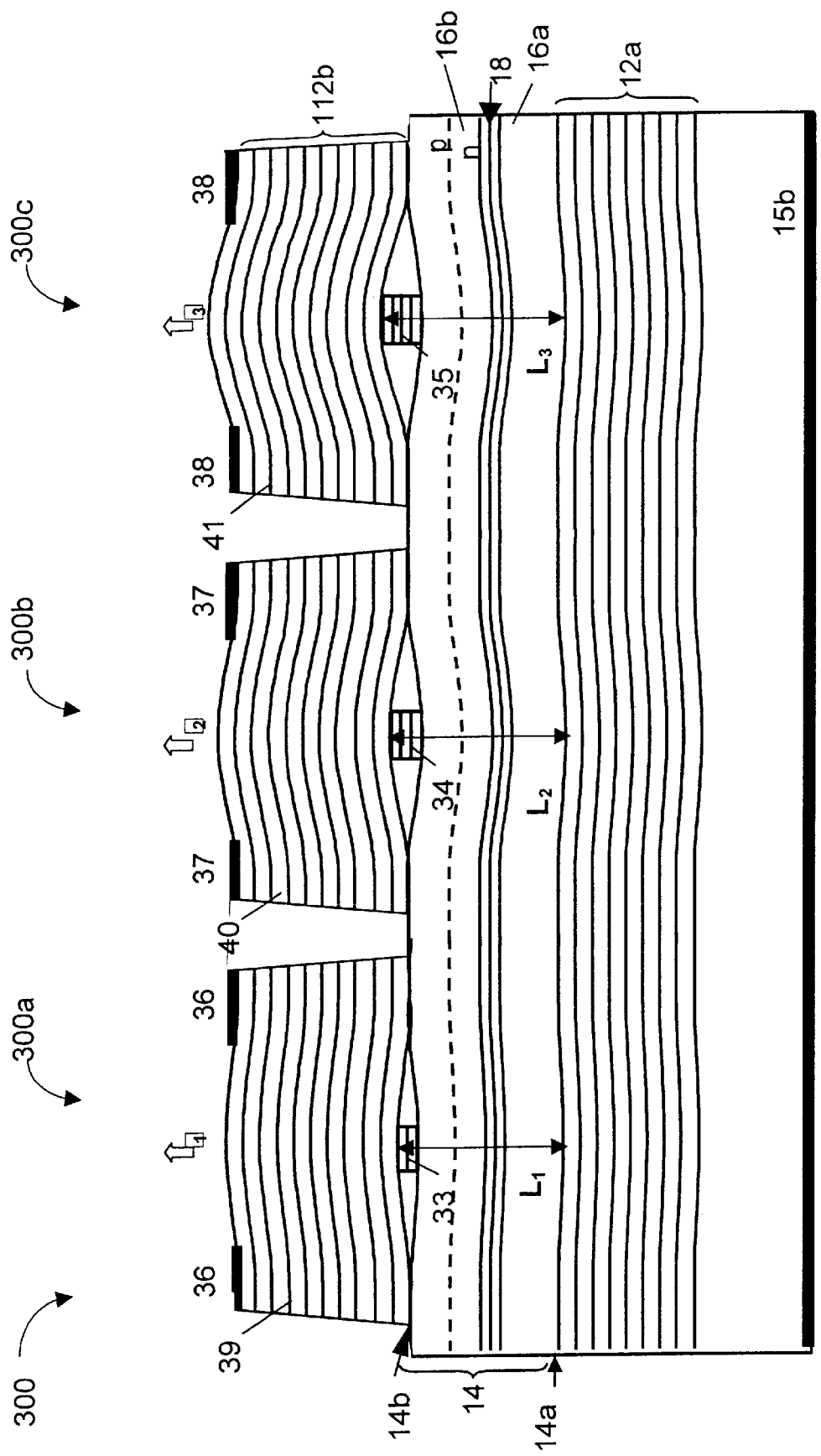
FIG. 8 is a schematic representation of an electrically pumped multiple wavelength VCSEL array according to the present invention.
Figure 9:
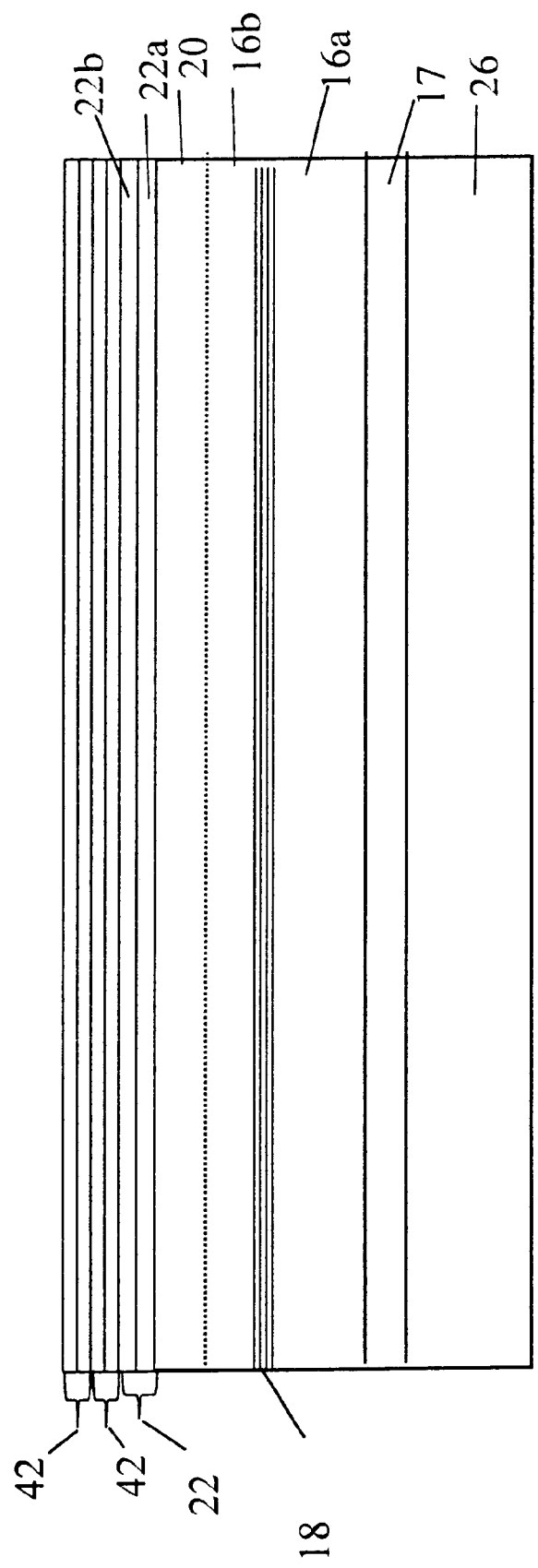
FIGS. 9 and 10 illustrate the fabrication of the device of FIG. 8.
Figure 10:
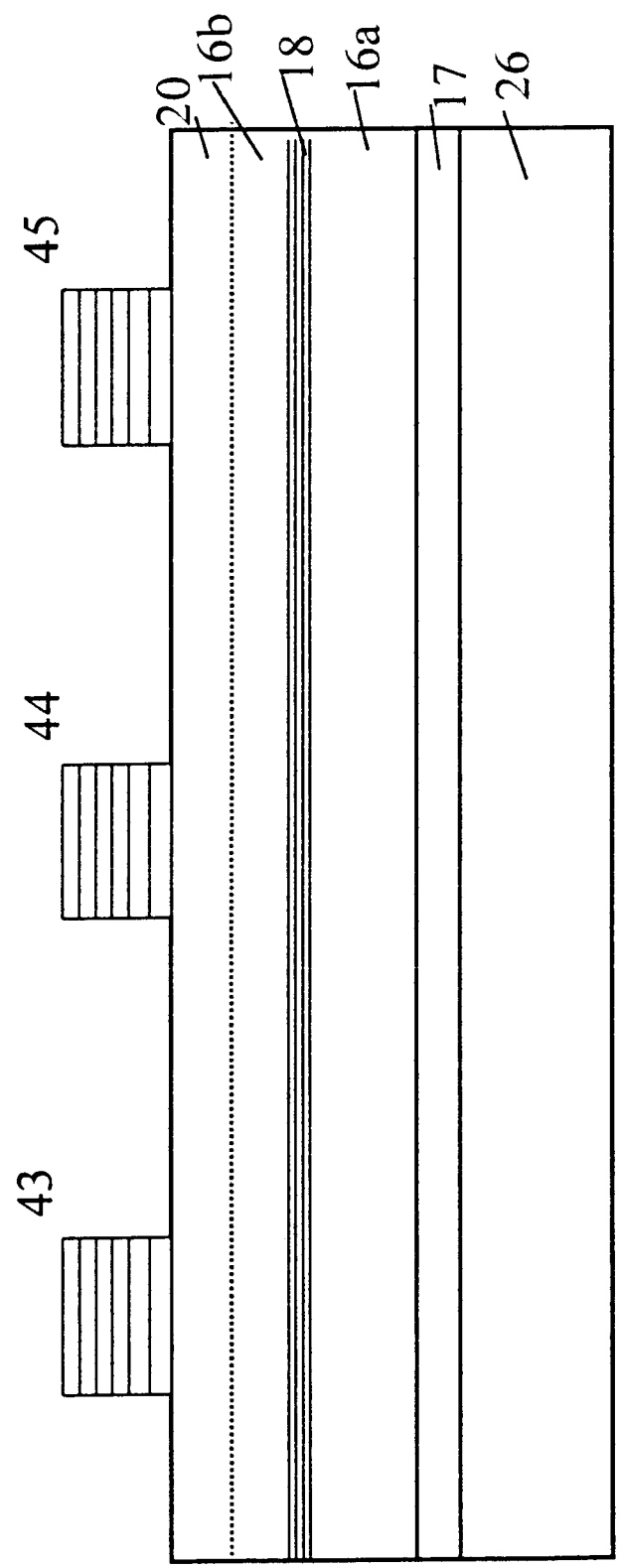

Turning now to FIGS. 8–10, there is illustrated a further embodiment of the present invention. FIG. 8 schematically shows a VCSEL device structure 300 in the form of a multiple wavelength VCSEL array, which, in the present example, comprises an array of three—VCSEL devices 300a, 300b and 300c emitting different wavelengths $\lambda_1$, $\lambda_2$ and $\lambda_3$, respectively. FIGS. 9 and 10 illustrate the fabrication of the device structure 300.

The emission of different wavelengths is obtained by providing different lengths $L_1$, $L_2$, $L_3$ of structured active cavity material within the adjacent devices 300a, 300b and 300c, respectively, due to different heights of mesas 33, 34 and 35. Annular ohmic contacts 36, 37 and 38 are formed on the top n-type DBR 12b, after selective etching of the top GaAs substrate. Then, isolation mesa-structures 39, 40 and 41 are formed in the top DBR 12b by reactive plasma etching in $Cl_2$—$CH_{-4}$—Ar. Each of the annular contacts 36, 37, 38 and the corresponding one of the isolation mesa-structures 39, 40, 41 are centered with respect to a vertical axis passing through the center of the corresponding one of the mesas 33, 34, 35, respectively. By applying a direct voltage between one of the top contacts 36, 37 or 38 and a bottom contact 15b, a current flow through the active region of the respective VCSEL device (330a, 330b or 300c) is provided, and light is emitted at the respective wavelength depending on the cavity length of this particular device.

For telecommunication applications, it is important to precisely control emission wavelengths of lasers in multiple wavelength VCSEL arrays in such a way that an equal wavelength separation between the VCSELs in the array is obtained. This can be performed by ensuring an equal cavity length separation L of neighboring devices. In this embodiment of the invention, as shown in FIG. 9, layers 22a and 22b of the tunnel junction are grown on the InP based cavity material, and then two pairs 42 of InP-InGaAsP layers are grown. Each layer in the pair-layers InP-InGaAsP has a thickness of 10 nm and a n-type doping level of $5 \cdot 10^{17}$ cm$^{-3}$. The composition of InGaAsP layers corresponds to $PL_{max}$ of 1.4 µm. Generally, this additional n-type layer is composed of a desired number of pairs $N_p$ of layers, every pair having two layers of different chemical composition. The relation between the desired number of separate wavelengths N and $N_P$ is $N_p$=N−1.

The above process of the layers formation is followed by selectively etching the layers 42 and the tunnel junction layers 22a and 22b in a $H_3PO_4:H_2O_2:H_2O$ based solution and HCl till reaching the p-type layer 20 of the InP-based cavity material to form mesas 43, 44 and 45 (FIG. 10). Each of the mesas 43, 44 and 45 has a diameter of 10 μm.

Turning back to FIG. 8, the above process of selective etching is followed by a precise mesa trimming using photolithography and selective etching in a $H_3PO_4:H_2O_2:H_2O$ based solution and HCl, resulting in the formation of mesas 33, 34 and 35 of different heights. Mesa 35 is composed of the tunnel junction layers 22a and 22b, and two pairs of layers 42 with a total height of 70 nm. Mesa 34 is composed of the tunnel junction layers 22a and 22b, and the pair of layers 42 with a total height of 50 nm. Mesa 33 is composed only of the tunnel junction layers 22a and 22b, and has a height of 30 nm. The difference between the optical cavity length of each two neighboring VCSEL devices in the array (300a and 300b, 300b and 330c) is the same (20 nm multiplied by the effective refractive index of the InP-InGaAsP pair layers) allowing obtaining an equal difference λ between emission wavelength of the neighboring VCSELs. In this particular example, the emission wavelength values of the devices with mesas 33, 34 and 35 have been measured to be 1520 nm, 1538 nm and 1556 nm, respectively, resulting in the λ of 18 nm.

Generally, in order to provide mesas of different heights, some mesas terminate with an additional n-type layer on top of the $n^{++}$ layer 22b of the tunnel junction. The additional n-type layer is composed of a certain number of pairs of layers, every pair having two layers of different chemical compositions. A portion of the additional n-type layer in the respective mesa has a thickness different from that of the other mesas. Considering d as the thickness of this additional n-type layer as being deposited and prior to being etched to form N different mesas, after the selective etching of this layer, the thickness $d_i$ of the remaining portion thereof in $i^{th}$ mesa (i=1, 2, ..., N) is $d_i' \equiv (i-1)d/(N-1)$. This thickness $d_i$ does not exceed ⅛ of the emission wavelength inside the respective VCSEL device, i.e. about 60 nm.

Those skilled in the art will readily appreciate that various modifications and changes can be applied to the preferred embodiment of the invention as hereinbefore exemplified without departing from its scope defined in and by the appended claims.

What is claimed is:

1. A vertical cavity surface emitting laser (VCSEL) device structure, which comprises a semiconductor active cavity material structure sandwiched between top and bottom Distributed Bragg Reflector (DBR) stacks, the top DBR including at least one n-type semiconductor layer, and which defines an active region for generating light in response to application of a direct voltage to device contacts, wherein:

said active cavity material comprises a multiquantum well layer stack sandwiched between bottom and top spacer regions, the top spacer region terminating with a p-layer and a $p^{++}/n^{++}$ tunnel junction on top of said p-layer, each of the $p^{++}$- and p-layer presenting a p-type layer, at least the upper $n^{++}$-layer of the tunnel junction being a mesa emerging from the underlying p-type layer, a structured surface of the active cavity material being formed by an upper surface of the mesa and an upper surface of the p-type layer outside the mesa;

said active region is defined by a current aperture including the mesa surrounded by an air gap between the fused structured surface of the active cavity material and the surface of the n-type semiconductor layer of the top DBR stack.

2. The device according to claim 1, wherein said tunnel junction is positioned at a minimum of a standing wave optical field of the device structure and has a thickness of about 20–50 nm.

3. The device according to claim 1, wherein the active cavity material also comprises an electrical confining layer in the cavity material outside the mesa.

4. The device according to claim 3, wherein said confining layer is an ion implantation layer.

5. The device according to claim 1, and also comprising at least one additional active region sandwiched between the top and bottom DBRs to be formed with additional electrical contacts for an electric current flow therethrough between the active cavity material structure and the DBR stack, said at least one additional active region being defined by an additional mesa surrounded by an air gap between the fused structured surface of the active cavity material and the surface of the n-type semiconductor layer of the top DBR stack, the at least two active regions being aligned in a spaced-apart relationship.

6. The device according to claim 5, wherein the at least two mesas have different heights, the at least two active regions being operable such that light emitted through the DBRs within the two active regions is of different wavelengths, respectively.

7. The device according to claim 6, wherein said at least one additional mesa terminates with an additional n-type layer on top of the $n^{++}$ layer of the tunnel junction having a thickness not exceeding ⅛ of the emission wavelength inside the VCSEL structure.

8. The device according to claim 7, wherein the additional n-type layer is composed of a certain number of pairs of layers, every pair having two layers of different chemical compositions.

9. The device according to claim 8, wherein N such additional mesas are provided, each of the additional mesas containing the additional n-type layer of a different thickness, as compared to that of the other additional mesas.

10. The device according to claim 9, wherein the difference between thickness values of the active cavity materials defined by each two locally adjacent active regions are equal, thereby providing an equal wavelength separation of the light emitted through the DBRs sandwiching each two locally adjacent active regions.

* * * * *